(12) United States Patent
Wang et al.

(10) Patent No.: US 7,804,689 B2
(45) Date of Patent: Sep. 28, 2010

(54) HIGH-POWER THYRISTOR MODULE HAVING COOLING EFFECT

(75) Inventors: Kuen-Cheng Wang, Taichung (TW); Tsair-Rong Chen, Changhua County (TW); Jeen-Sheen Row, Changhua (TW)

(73) Assignees: Kuen-Cheng Wang, Taichung (TW); The Department of Electrical Engineering National Chang-Hua University of Education, Changhua County (TW)

( * ) Notice: Subject to any disclaimer, the term of this patent is extended or adjusted under 35 U.S.C. 154(b) by 57 days.

(21) Appl. No.: 12/264,584

(22) Filed: Nov. 4, 2008

(65) Prior Publication Data

US 2009/0284922 A1 Nov. 19, 2009

(30) Foreign Application Priority Data

May 14, 2008 (TW) .................................. 097208357

(51) Int. Cl.
*H05K 7/20* (2006.01)
(52) U.S. Cl. ........................ 361/717; 361/613; 361/699; 257/714; 257/686; 363/141
(58) Field of Classification Search .................. 361/703, 361/704, 710, 716, 719, 613, 647, 697, 699
See application file for complete search history.

(56) References Cited

U.S. PATENT DOCUMENTS

| 3,603,381 | A | * | 9/1971 | Scherbaum et al. | ........ | 165/80.4 |
| 3,805,140 | A | * | 4/1974 | Takahashi et al. | ........... | 363/141 |
| 4,023,616 | A | * | 5/1977 | Scherbaum | ................ | 165/80.4 |
| 4,675,720 | A | * | 6/1987 | Ikegame et al. | ............. | 257/714 |
| 6,532,154 | B2 | * | 3/2003 | Eady et al. | .................. | 361/719 |
| 2003/0066638 | A1 | * | 4/2003 | Qu et al. | ..................... | 165/186 |
| 2004/0089934 | A1 | * | 5/2004 | Shimoida et al. | ............ | 257/686 |

\* cited by examiner

*Primary Examiner*—Jayprakash N Gandhi
*Assistant Examiner*—Courtney Smith
(74) *Attorney, Agent, or Firm*—McNees Wallace & Nurick, LLC

(57) ABSTRACT

A high-power thyristor module includes a housing configured with an inner receiving space, and a thyristor unit disposed in the inner receiving space in the housing and including a mounting frame, and a plurality of high-power thyristors mounted on the mounting frame. Each thyristor has a gate. The mounting frame includes a dielectric top plate disposed on a top side of the housing, and a plurality of electrodes mounted on the top plate so that the electrodes are exposed outwardly of the housing, and coupled respectively to the gates of the thyristors. Cooling oil is contained in the inner receiving space so that the thyristors are submerged thereby.

19 Claims, 3 Drawing Sheets

HIGH-POWER THYRISTOR MODULE HAVING COOLING EFFECT

BACKGROUND OF THE INVENTION

1. Field of the Invention

The invention relates to a high-power thyristor module, more particularly to a high-power thyristor module having a cooling effect.

2. Description of the Related Art

Generally, a conventional water cooling system is used to dissipate heat generated by high-power thyristors. However, when high-power thyristors are placed in a region lacking for water, for example, a mountain region, the conventional water cooling system is not suitable for the high-power thyristors. Furthermore, water has an inferior stability, and easily evaporates. Therefore, parts of the conventional water cooling system in contact with water easily rust, thereby resulting in reduced service life and heat-dissipating efficiency.

SUMMARY OF THE INVENTION

Therefore, the object of the present invention is to provide a high-power thyristor module having a cooling effect that can overcome the aforesaid drawbacks of the prior art.

According to the present invention, a high-power thyristor module comprises:

a housing configured with an inner receiving space;

a thyristor unit disposed in the inner receiving space in the housing, the thyristor including a mounting frame, and a plurality of high-power thyristors mounted on the mounting frame, each of the thyristors having a gate, the mounting frame including a dielectric top plate disposed on a top side of the housing, and a plurality of electrodes mounted on the top plate so that the electrodes are exposed outwardly of the housing, and coupled respectively to the gates of the thyristors; and cooling oil contained in the inner receiving space so that the thyristors are submerged thereby.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
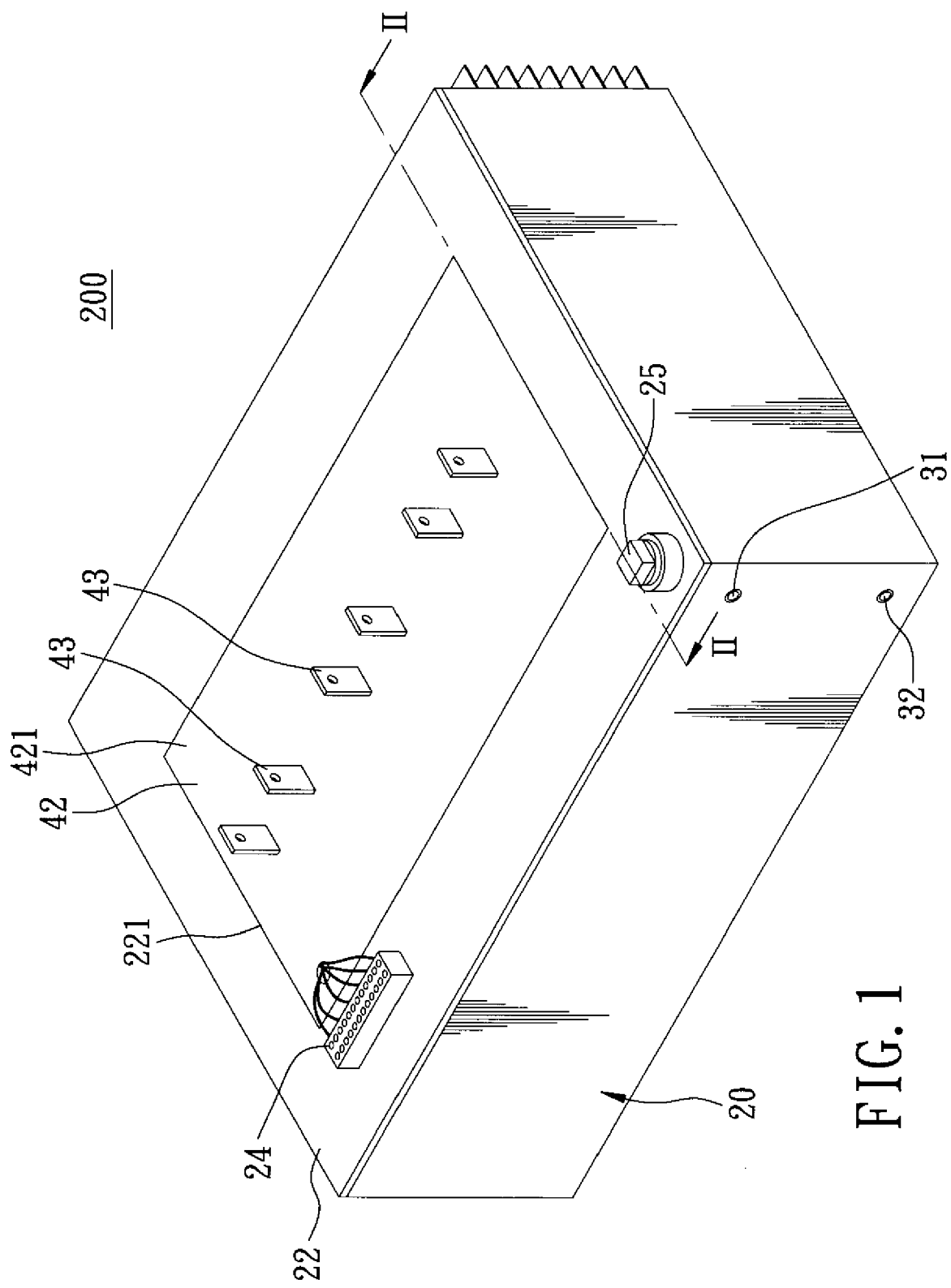
FIG. 1 is a perspective view showing the preferred embodiment of a high-power thyristor module according to the present invention.
Figure 2:
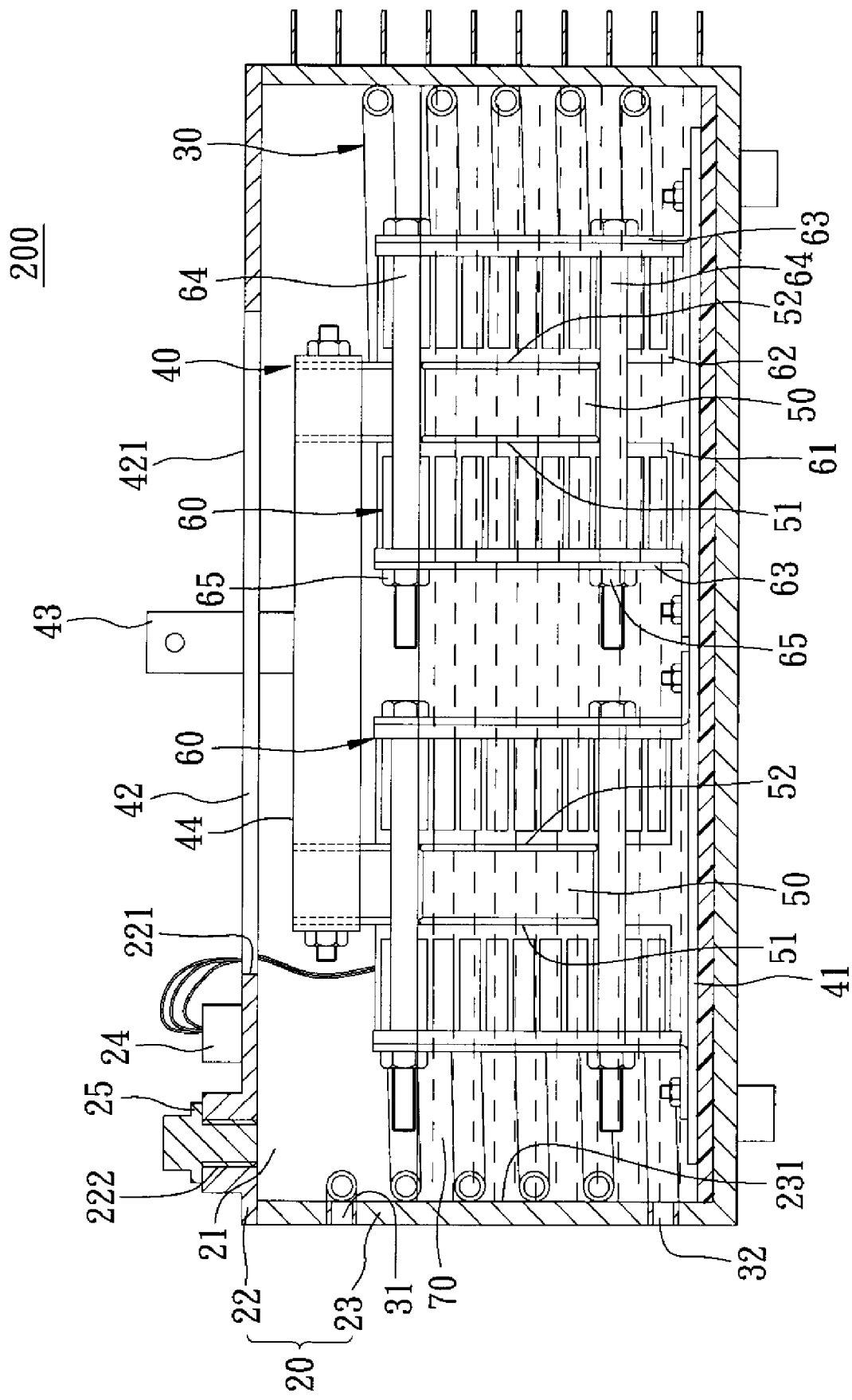
FIG. 2 is a schematic sectional view of the preferred embodiment taken along line II-II in FIG. 1.
Figure 3:
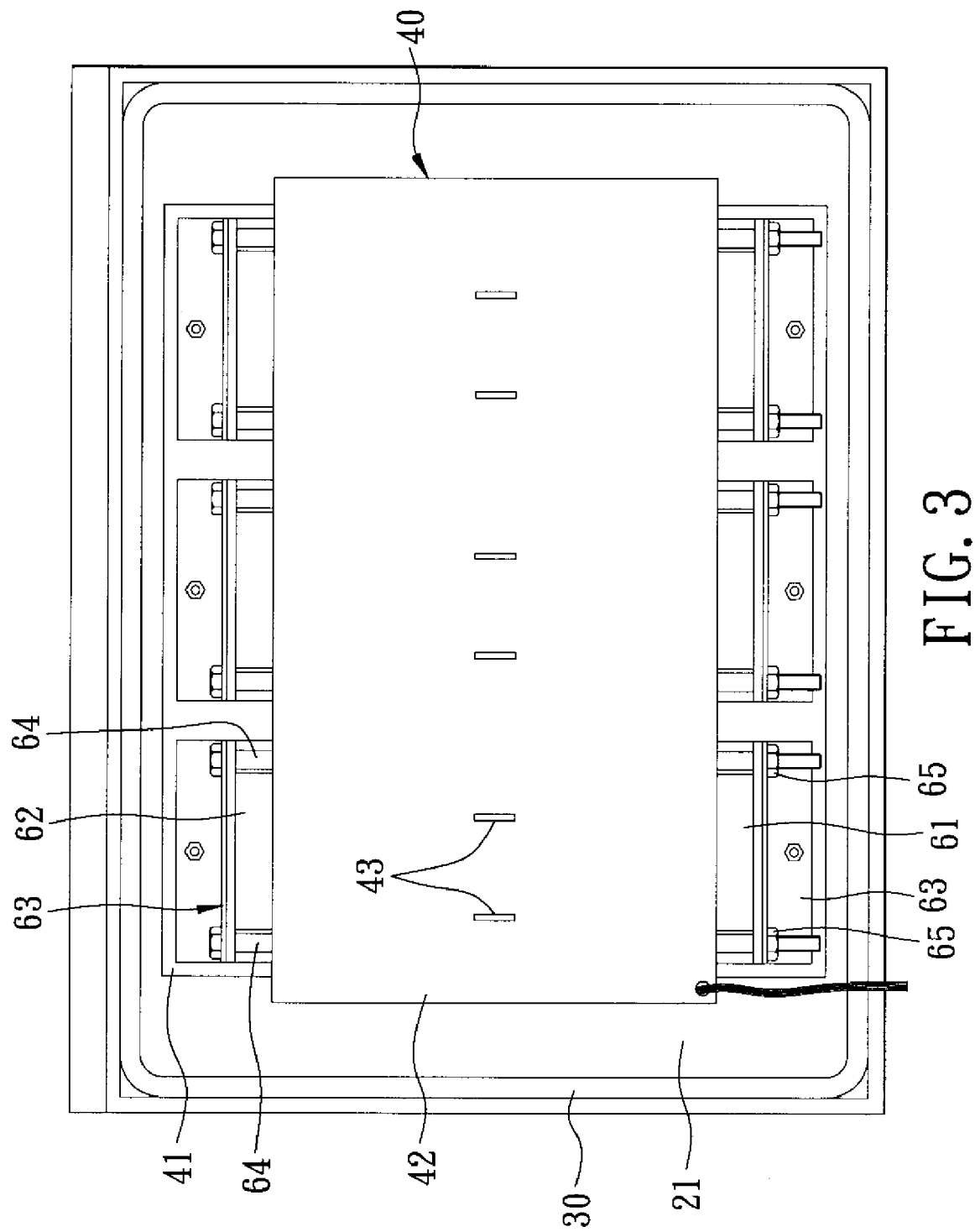
FIG. 3 is a schematic top view showing the preferred embodiment without an upper cover body.

Referring to FIGS. 1 to 3, the preferred embodiment of a high-power thyristor module 200 according to the present invention is shown to include a housing 20, a thyristor unit, and cooling oil 70.

The housing 20 has a lower case body 23, and an upper cover body 22 cooperating with the lower case body 23 to define an inner receiving space 21 therebetween. The upper cover body 22 is formed with a central opening 221 and an oil inlet 222 that are in spatial communication with the inner receiving space 21. The housing 20 further has a plug 25 for plugging the oil inlet 222, and a terminal seat 24 mounted on the upper cover body 22.

The thyristor unit is disposed in the inner receiving space 21 in the housing 20. In this embodiment, the thyristor unit includes a mounting frame 40, a plurality of high-power thyristors 50, and a plurality of heat sink units 60.

In this embodiment, each thyristor 50 is a silicon controlled rectifier (SCR), and has a gate (not shown), and opposite first and second heat-generating surfaces 51, 52 that serve as anode and cathode, respectively. The anodes and the cathodes of the thyristors 50 are coupled to the terminal seat 24 of the housing 20 via cables. In other embodiments, each thyristor 50 can be a gate controlled switch (GCS) or a silicon controlled switch (SCS).

The mounting frame 40 includes a main frame portion 44, dielectric top and bottom plates 42, 41, and a plurality of electrodes 43. The main frame portion 44 is mounted with the thyristors thereon. The top plate 42 is connected to the main frame portion 44, is disposed on a top side of the housing 20 and is mounted fittingly in the opening 221 in the upper cover body 22. The bottom plate 41 is disposed under the top plate 42 and is spaced apart from the thyristors 50. The electrodes 43 are mounted on the top plate 42, project upwardly from a top surface 421 of the top plate 42 such that the electrodes 43 are exposed outwardly of the housing 20, and are coupled respectively to the gates of the thyristors 50.

Each heat sink unit 60 is disposed fixedly on the bottom plate 41 for dissipating heat generated by a corresponding one of the thyristors 50. In this embodiment, each heat sink unit 60 includes first and second heat sinks 61, 62, a pair of clamping plates 63 and an anchoring member. For each heat sink unit 60, the first and second heat sinks 61, 62 abut against and are in thermal contact with the first and second heat generating surfaces 51, 52 of a corresponding one of the thyristors 50, respectively, as shown in FIG. 2. The clamping plates 63 are mounted uprightly on the bottom plate 41, and are spaced apart from each other for clamping the first heat sink 61, the corresponding one of the thyristors 50 and the second heat sink 62 therebetween. The anchoring member retains the clamping plates 63 to clamp the first heat sink 61, the corresponding one of the thyristors 50 and the second heat sink 62 therebetween. In this embodiment, the anchoring member includes a plurality of connecting bolts 64 extending through the clamping plate 63 and arranged along peripheries of the clamping plates 63, and a plurality of nuts 65 engaging threadedly and respectively free ends of the connecting bolts 64.

The cooling oil 70 is infused into the inner receiving space 21 in the housing 20 through the oil inlet 222 in the upper cover body 22 of the housing so that the thyristors 50 are submerged by the cooling oil 70 contained in the inner receiving space 21.

The high-power thyristor module 200 further includes a pipe 30 disposed in the inner receiving space 21 in the housing 20. The pipe 30 has a first end 31 extending through the lower case body 23 and disposed adjacent to the top side of the housing 20, and a second end 32 opposite to the first end 31, extending through the lower case body 23 and disposed adjacent to a bottom side of the housing 20. In this embodiment, the pipe 30 is helical and is attached to a looped inner surrounding surface 231 of the lower case body 23 of the housing 20. The pipe 30 is adapted to permit a heat exchanging coolant from an external coolant source (not shown), such as water, to flow into the pipe 30 through the first end 31 and to flow out of the pipe 30 through the second end 32.

In sum, due to the presence of the cooling oil 70, heat generated by the thyristors 50 can be effectively dissipated. Furthermore, since the cooling oil 70 has a superior stability as compared to water, the high-power thyristor module 200 of the present invention has a relatively long service life as compared to the aforesaid conventional water cooling system.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. A high-power thyristor module comprising:
    a housing configured with an inner receiving space;
    a thyristor unit disposed in said inner receiving space in said housing, said thyristor unit including a mounting frame, and a plurality of high-power thyristors mounted on said mounting frame, each of said thyristors having a gate, said mounting frame including a dielectric top plate disposed on a top side of said housing, and a plurality of electrodes mounted on said top plate so that said electrodes are exposed outwardly of said housing, and coupled respectively to said gates of said thyristors;
    cooling oil contained in said inner receiving space so that said thyristors are submerged thereby;
    wherein said mounting frame of said thyristor unit further includes a dielectric bottom plate disposed under said top plate and spaced apart from said thyristors; and
    wherein said thyristor unit further includes a plurality of heat sink units each disposed fixedly on said bottom plate for dissipating heat generated by a corresponding one of said thyristors.

2. The high-power thyristor module as claimed in claim 1, wherein said housing has a lower case body, and an upper cover body cooperating with said lower case body to define said inner receiving space therebetween, said upper cover body being formed with an oil inlet in spatial communication with said inner receiving space for infusing said cooling oil into said inner receiving space therethrough, said housing further having a plug for plugging said oil inlet.

3. The high-power thyristor module as claimed in claim 2, wherein:
    said upper cover body is formed with an opening for mounting fittingly said top plate of said mounting frame therein; and
    said top plate of said mounting frame of said thyristor unit has a top surface from which said electrodes project upwardly.

4. The high-power thyristor module as claimed in claim 2, wherein:
    each of said thyristors of said thyristor unit further has an anode and a cathode; and
    said housing further has a terminal seat mounted on said upper cover body and coupled to said anodes and said cathodes of said thyristors.

5. The high-power thyristor module as claimed in claim 1, further comprising a pipe disposed in said inner receiving space in said housing and having a first end extending through said housing and disposed adjacent to said top side of said housing, and a second end opposite to said first end, extending through said housing and disposed adjacent to a bottom side of said housing, said pipe being adapted to permit a heat exchanging coolant from an external coolant source to flow thereinto through said first end and to flow out of said pipe through said second end.

6. The high-power thyristor module as claimed in claim 5, wherein said pipe is helical and is attached to a looped inner surrounding surface of said housing.

7. The high-power thyristor module as claimed in claim 1, wherein:
    each of said thyristors of said thyristor unit has a first heat-generating surface; and
    each of said heat sink units includes
    a first heat sink abutting against and in thermal contact with said first heat generating surface of a corresponding one of said thyristors,
    a pair of clamping plates mounted uprightly on said bottom plate and spaced apart from each other for clamping said first heat sink and the corresponding one of said thyristors therebetween, and
    an anchoring member for retaining said clamping plates to clamp said first heat sink and the corresponding one of said thyristors therebetween.

8. The high-power thyristor module as claimed in claim 7, wherein:
    each of said thyristors of said thyristor unit further has a second heat-generating surface opposite to said first heat-generating surface;
    each of said heat sink units further includes a second heat sink abutting against and in thermal contact with said second heat generating surface of the corresponding one of said thyristors; and
    said clamping plates clamp said first heat sink, the corresponding one of said thyristors and said second heat sink therebetween.

9. The high-power thyristor module as claimed in claim 7, wherein said anchoring member of each of said heat sink units includes a plurality of connecting bolts extending through said clamping plates of a corresponding one of said heat sink units and arranged along peripheries of said clamping plates of the corresponding one of said heat sink units, and a plurality of nuts engaging threadedly and respectively free ends of said connecting bolts.

10. The high-power thyristor module as claimed in claim 1, wherein each of said thyristors includes one of a silicon controlled rectifier, a gate controlled switch and a silicon controlled switch.

11. A high-power thyristor module comprising:
    a housing configured with an inner receiving space;
    a thyristor unit disposed in said inner receiving space in said housing, said thyristor unit including a mounting frame, and a plurality of high-power thyristors mounted on said mounting frame, each of said thyristors having a gate, said mounting frame including a dielectric top plate disposed on a top side of said housing, and a plurality of electrodes mounted on said top plate so that said electrodes are exposed outwardly of said housing, and coupled respectively to said gates of said thyristors;
    cooling oil contained in said inner receiving space so that said thyristors are submerged thereby; and
    a pipe disposed in said inner receiving space in said housing and having a first end extending through said housing and disposed adjacent to said top side of said housing, and a second end opposite to said first end, extending through said housing and disposed adjacent to a bottom side of said housing, said pipe being adapted to permit a heat exchanging coolant from an external coolant source to flow thereinto through said first end and to flow out of said pipe through said second end;

wherein said pipe is helical and is attached to a looped inner surrounding surface of said housing.

12. The high-power thyristor module as claimed in claim 11, wherein said housing has a lower case body, and an upper cover body cooperating with said lower case body to define said inner receiving space therebetween, said upper cover body being formed with an oil inlet in spatial communication with said inner receiving space for infusing said cooling oil into said inner receiving space therethrough, said housing further having a plug for plugging said oil inlet.

13. The high-power thyristor module as claimed in claim 12, wherein:
said upper cover body is formed with an opening for mounting fittingly said top plate of said mounting frame therein; and
said top plate of said mounting frame of said thyristor unit has a top surface from which said electrodes project upwardly.

14. The high-power thyristor module as claimed in claim 12, wherein:
each of said thyristors of said thyristor unit further has an anode and a cathode; and
said housing further has a terminal seat mounted on said upper cover body and coupled to said anodes and said cathodes of said thyristors.

15. The high-power thyristor module as claimed in claim 11, wherein:
said mounting frame of said thyristor unit further includes a dielectric bottom plate disposed under said top plate and spaced apart from said thyristors; and
said thyristor unit further includes a plurality of heat sink units each disposed fixedly on said bottom plate for dissipating heat generated by a corresponding one of said thyristors.

16. The high-power thyristor module as claimed in claim 15, wherein:
each of said thyristors of said thyristor unit has a first heat-generating surface; and
each of said heat sink units includes:
a first heat sink abutting against and in thermal contact with said first heat generating surface of a corresponding one of said thyristors,
a pair of clamping plates mounted uprightly on said bottom plate and spaced apart from each other for clamping said first heat sink and the corresponding one of said thyristors therebetween, and
an anchoring member for retaining said clamping plates to clamp said first heat sink and the corresponding one of said thyristors therebetween.

17. The high-power thyristor module as claimed in claim 16, wherein:
each of said thyristors of said thyristor unit further has a second heat-generating surface opposite to said first heat-generating surface;
each of said heat sink units further includes a second heat sink abutting against and in thermal contact with said second heat generating surface of the corresponding one of said thyristors; and
said clamping plates clamp said first heat sink, the corresponding one of said thyristors and said second heat sink therebetween.

18. The high-power thyristor module as claimed in claim 16, wherein said anchoring member of each of said heat sink units includes a plurality of connecting bolts extending through said clamping plates of a corresponding one of said heat sink units and arranged along peripheries of said clamping plates of the corresponding one of said heat sink units, and a plurality of nuts engaging threadedly and respectively free ends of said connecting bolts.

19. The high-power thyristor module as claimed in claim 11, wherein each of said thyristors includes one of a silicon controlled rectifier, a gate controlled switch and a silicon controlled switch.

* * * * *